United States Patent
Han et al.

(10) Patent No.: US 7,060,603 B2
(45) Date of Patent: Jun. 13, 2006

(54) METHODS OF FORMING METAL WIRING OF SEMICONDUCTOR DEVICES INCLUDING SINTERING THE WIRING LAYERS AND FORMING A VIA HOLE WITH A BARRIER METAL

(75) Inventors: Jae-Won Han, Kyungki-do (KR); Dong-Ki Jeon, Seoul (KR)

(73) Assignee: DongbuAnam Semiconductor Inc., Seoul (KR)

(*) Notice: Subject to any disclaimer, the term of this patent is extended or adjusted under 35 U.S.C. 154(b) by 0 days.

(21) Appl. No.: 10/741,834

(22) Filed: Dec. 19, 2003

(65) Prior Publication Data

US 2004/0132283 A1 Jul. 8, 2004

(30) Foreign Application Priority Data

Dec. 20, 2002 (KR) ...................... 10-2002-0082005

(51) Int. Cl.
*H01L 21/4763* (2006.01)

(52) U.S. Cl. ...................... 438/618; 438/620; 438/622; 438/628

(58) Field of Classification Search ................ 438/618, 438/620, 622, 628
See application file for complete search history.

(56) References Cited

U.S. PATENT DOCUMENTS

| 5,136,362 | A |   | 8/1992 | Grief et al. ................. 257/751 |
| 5,691,572 | A | * | 11/1997 | Chung ......................... 257/751 |
| 6,313,027 | B1 |   | 11/2001 | Xu et al. ..................... 438/627 |
| 6,395,381 | B1 |   | 5/2002 | Kondo et al. ............ 438/317.9 |
| 6,436,823 | B1 |   | 8/2002 | Cabral, Jr. et al. .......... 438/686 |
| 2003/0170975 | A1 | * | 9/2003 | Griffin et al. ............... 438/637 |

OTHER PUBLICATIONS

Wolf, Silicon Processing for the VLSI Era, V. I., 1986, pp. 164-166, 188-191, 238-239.*

* cited by examiner

*Primary Examiner*—William M. Brewster
(74) *Attorney, Agent, or Firm*—Andrew D. Fortney

(57) ABSTRACT

A formation method of metal wiring of a semiconductor device is disclosed. According to one example, an example method may include forming a metal wire on a pre metal dielectric ("PMD") on a semiconductor substrate; patterning and sintering the metal wire; forming an insulating layer on the metal wire and the PMD; and forming a via hole in the insulating layer. The example method may further include forming a barrier metal layer made of multiple metal layers on inner wall of the via hole and upper surface of the insulating layer using physical vapor deposition and chemical vapor deposition; filling up inside the via hole by forming a metallic material on the metal layer; and forming a metallic material via by chemical mechanical polishing of the metallic material and the barrier metal layer until the insulating layer is exposed.

12 Claims, 4 Drawing Sheets

METHODS OF FORMING METAL WIRING OF SEMICONDUCTOR DEVICES INCLUDING SINTERING THE WIRING LAYERS AND FORMING A VIA HOLE WITH A BARRIER METAL

TECHNICAL FIELD

The present disclosure relates to semiconductor devices and, more particularly, to methods of forming metal wiring of semiconductor devices.

BACKGROUND

In general, semiconductor devices include wires (metal such as tungsten, aluminum, copper, titanium, titanium nitride wire, etc.) and contacts or vias connecting the wires.

Presently, wires are formed in multiple layers and design rules decrease, which enables highly integrated circuit. Now, a conventional formation method of metal wiring of a semiconductor device is described in detail with reference to the accompanying drawings. FIGS. 1a–1f are sectional views showing a formation method of metal wiring.

First, as shown in FIG. 1a, a lower titanium layer 2, an aluminum layer 3, an upper titanium layer 4, and a titanium nitride layer 5 are sequentially deposited on a semiconductor substrate 1 to form a metal multi-layered structure M of lower titanium/aluminum/upper titanium/titanium nitride. Alternatively, a lower titanium layer 2, a lower titanium nitride layer (not shown), an aluminum layer 3, an upper titanium layer 4, and an upper titanium nitride layer 5 are sequentially deposited to form a metal multi-layered structure M of lower titanium/lower titanium nitride/aluminum/upper titanium/upper titanium nitride. As a further alternative, a lower titanium layer 2, an aluminum layer 3, and an upper titanium layer 4 are sequentially deposited to form a metal multi-layered structure M of lower titanium/aluminum/upper titanium.

The metal multi-layered structure M applies to all multi-layered metal layers except the uppermost metal layer. If the metal multi-layered structure M applies to the undermost metal layer, state of a substrate is that contact holes filled up with tungsten plugs are formed in a pre metal dielectric ("PMD"). If the metal multi-layered structure M applies to the metal layer after the undermost metal layer except the uppermost metal layer, state of a substrate is that via holes filled up with tungsten plugs are formed in a inter metal dielectric ("IMD") on a multi-layered metal layer that is patterned and sintered according to the design.

Next, as shown in FIG. 1b, the multi-layered structure is patterned and sintered to form metal wiring according to the design.

Subsequently, as shown in FIG. 1c, a lower layer 7 is formed using high density plasma ("HDP") or spin on glass ("SOG") methods to fill the gap. An interlayer insulating layer 8 is formed to an extent that surface configuration of the lower layer 7 is not shown and the interlayer insulating layer 8 is planarized using chemical mechanical polishing ("CMP").

Subsequently, as shown in FIG. 1d, via holes 9 are formed in the interlayer insulating layer 8. During the etching process for forming via holes, the titanium nitride layer 5 and the upper titanium layer 4 are over-etched and the etching process is stopped at the aluminum layer 3 in the metal multi-layered structure M to reduce via hole resistance and decrease variation of via hole resistances in a wafer.

Then, as shown in FIG. 1e, a barrier metal layer having a multi-layered structure of titanium 10/titanium nitride 11 is formed in-situ on the interlayer insulating layer 8 including the via holes 9.

The titanium layer 10 of the barrier metal layer is formed to have a thickness between about 100–300 Å using sputtering method designed to be well-formed to narrow and deep via holes. The titanium nitride layer 11 is formed to have a thickness between approximately 80–150 Å using chemical vapor deposition ("CVD") to improve the bottom step coverage of the barrier metal layer because the via holes become narrower and deeper due to high integration of semiconductor device.

Next, as shown in FIG. 1f, a tungsten layer 12 is formed to fill the via holes 9 fully or substantially fully. The tungsten layer 12 is planarized by CMP until the interlayer insulating layer 8 is exposed. Now, tungsten plugs 12 inside the via holes 9 are completed.

Alternatively, the tungsten layer 12 can be planarized by etching back the tungsten layer 12 until the barrier metal layer 11 on the interlayer insulating layer 8 is exposed.

Formation of via holes of a semiconductor device is completed using the above method, and the above process can be repeated as many as the number of the metal layers needed in a semiconductor device.

However, over shooting, which is generated when heat is applied during the CVD deposition of the titanium nitride layer, which is a part of a barrier metal layer, causes the aluminum layer to become loose.

Electrical connection of the semiconductor device is incomplete if the aluminum layer gets loose, which causes a defect in the semiconductor device.

Prior approaches to forming wiring using titanium include the following U.S. patents.

U.S. Pat. No. 6,436,823 discloses a wire formation technique using two-step annealing of titanium deposited on a silicon layer. U.S. Pat. No. 6,395,381 discloses a CVD having heat resistance, heat barrier, and heat shock. U.S. Pat. No. 5,136,362 discloses a formation method of a contact using titanium and titanium nitride. U.S. Pat. No. 6,313,027 discloses a method of preventing conductive material of aluminum from diffusing at a contact area during fabrication process, and so forth.

DETAILED DESCRIPTION

Figure 1A:
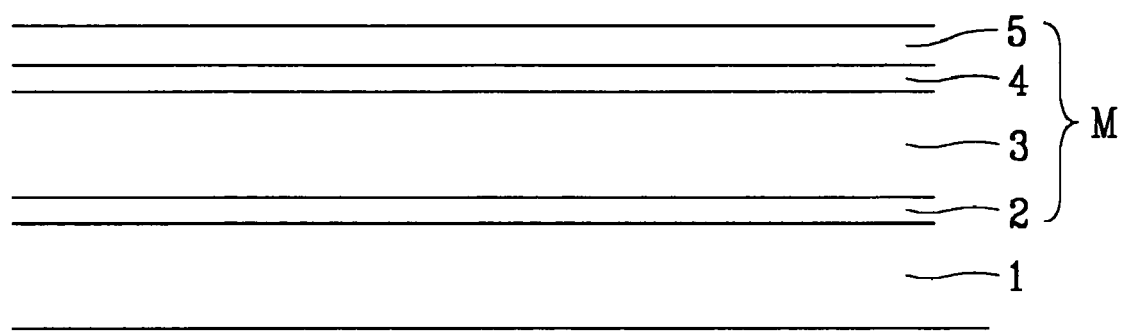
FIGS. 1a–1f are sectional views illustrating a formation method of metal wiring.

As shown in FIG. 1a, a lower titanium layer 2, an aluminum layer 3, an upper titanium layer 4, and a titanium nitride layer 5 are sequentially deposited on a semiconductor substrate 1 to form a metal multi-layered structure M of lower titanium/aluminum/upper titanium/titanium nitride. Alternatively, a lower titanium layer 2, a lower titanium nitride layer (not shown), an aluminum layer 3, an upper titanium layer 4, and an upper titanium nitride layer 5 are sequentially deposited to form a metal multi-layered structure M of lower titanium/lower titanium nitride/aluminum/upper titanium/upper titanium nitride. Alternatively, a lower titanium layer 2, an aluminum layer 3, and an upper titanium layer 4 are sequentially deposited to form a metal multi-layered structure M of lower titanium/aluminum/upper titanium.

The metal multi-layered structure M applies to all multi-layered metal layers except the uppermost metal layer. If the metal multi-layered structure M applies to the undermost metal layer, state of a substrate is that contact holes filled up with tungsten plugs are formed in a pre metal dielectric ("PMD"). If the metal multi-layered structure M applies to the metal layer after the undermost metal layer except the uppermost metal layer, state of a substrate is that via holes filled up with tungsten plugs are formed in a inter metal dielectric ("IMD") on a multi-layered metal layer which is patterned and sintered according to the design. It is preferable that the PMD is made of BPSG, BSG, or PSG.

Figure 1B:
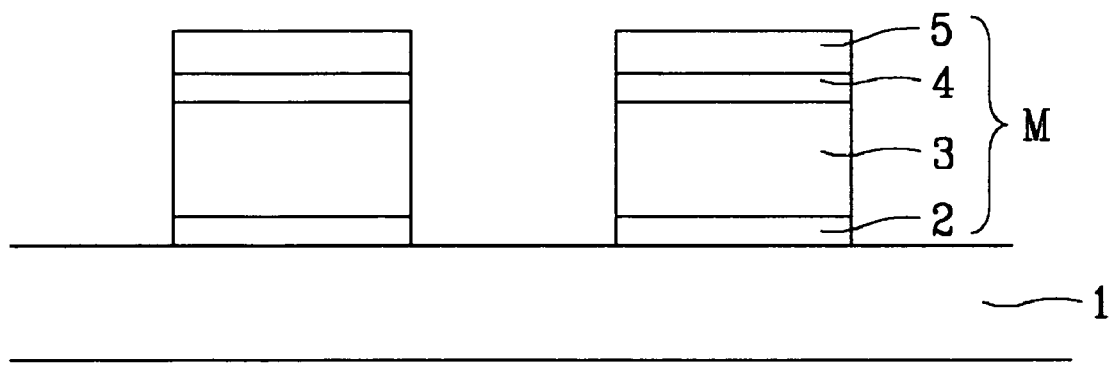

Next, as shown in FIG. 1b, the multi-layered structure is patterned and sintered according to the design to form metal wiring.

The multi-layered structure is sintered at the temperature of 400–450° C. for 20–50 minutes in an electric furnace is performed for reaction of the aluminum and the upper titanium after the metal wire etching.

Figure 1C:
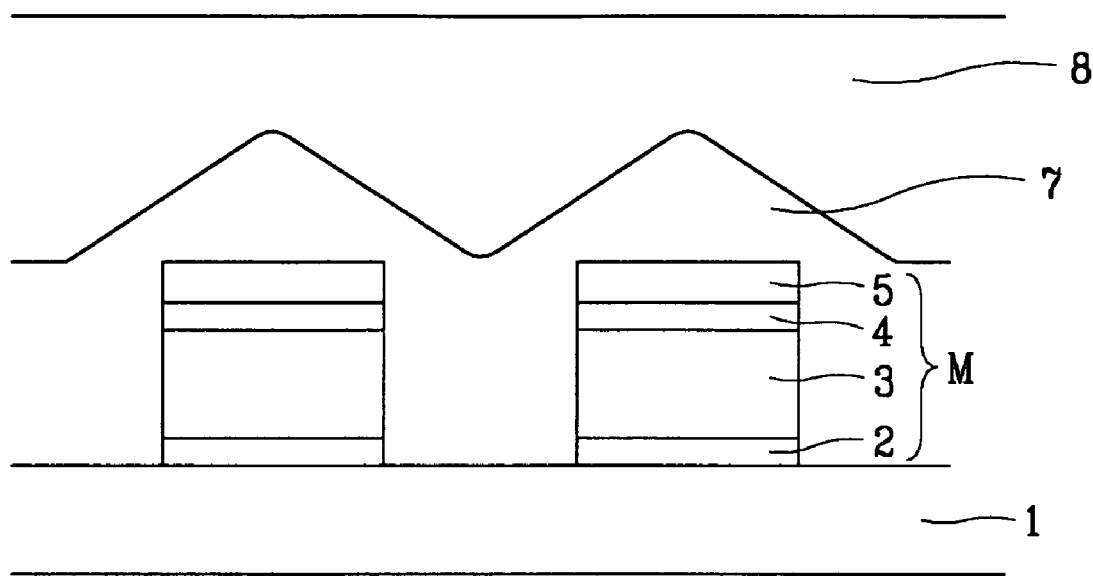

Subsequently, as shown in FIG. 1c, a lower layer 7 is formed to fill up the gap using high density plasma ("HDP") or spin on glass ("SOG") method, an interlayer insulating layer 8 is formed to an extent that surface configuration of the lower layer 7 is not shown, and the interlayer insulating layer 8 is planarized using chemical mechanical polishing ("CMP").

Figure 1D:
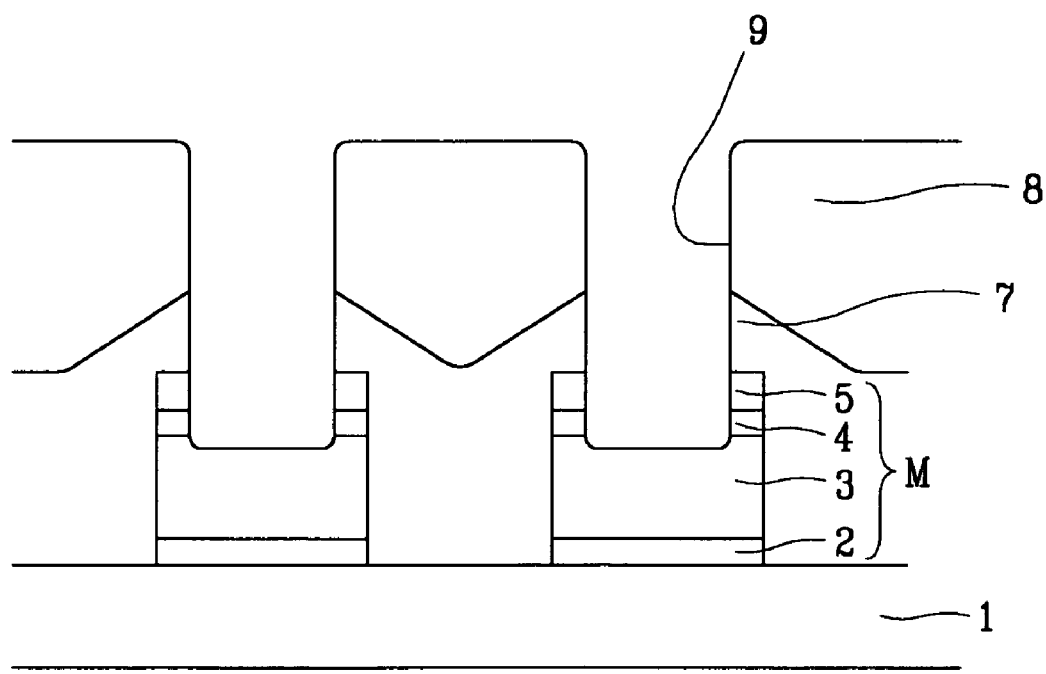

Subsequently, as shown in FIG. 1d, via holes 9 are formed in the interlayer insulating layer 8. During the etching process for forming via holes, the titanium nitride layer 5 and the upper titanium layer 4 are over-etched and the etching process is stopped at the aluminum layer 3 in the metal multi-layered structure M to reduce via hole resistance and decrease variation of via hole resistances in a wafer.

Figure 1E:
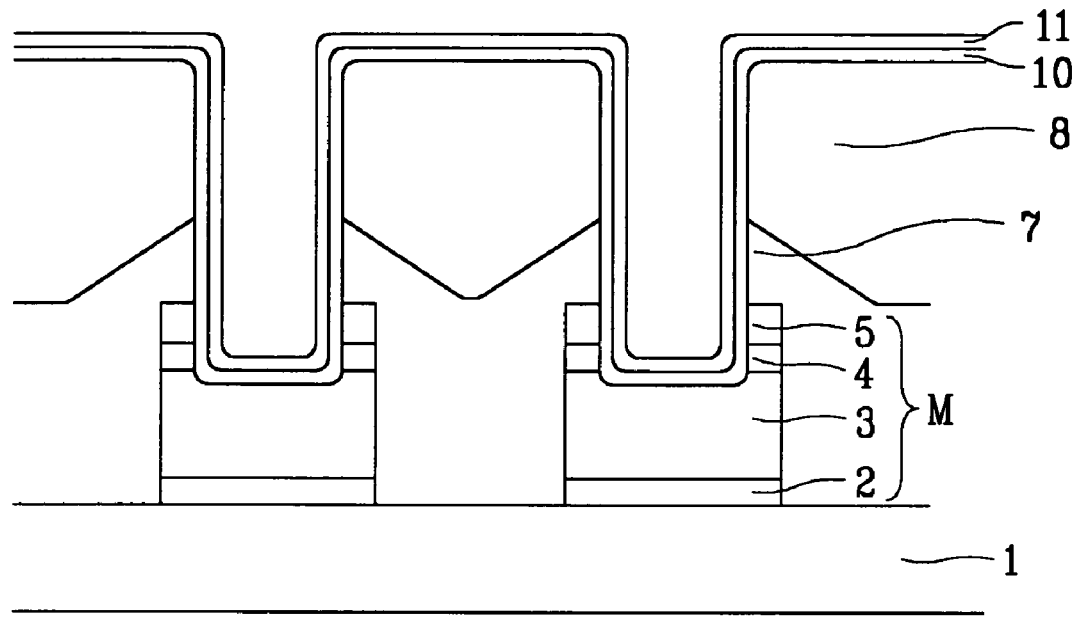

Then, as shown in FIG. 1e, a barrier metal layer having a multi-layered structure of titanium 10/titanium nitride 11 is formed in-situ on the interlayer insulating layer 8 including the via holes 9.

The titanium layer 10 of the barrier metal layer is formed using physical vapor deposition ("PVD") designed to be well-formed to narrow and deep via holes. The titanium nitride layer 11 is formed using chemical vapor deposition ("CVD") to improve the bottom step coverage of the barrier metal layer because the via holes become narrower and deeper due to high integration of semiconductor device.

A CVD chamber for forming the titanium nitride layer 11 is pre-heated during 35–50 seconds under pressure of 1.5–3.5 Torr, which is adjusted and fixed by controlling gate valve while N2 200–400 sccm and He 400–600 sccm are flowed in the chamber.

It is preferable that temperature of the heater equipped in the CVD chamber is 380–480° C. during the process.

Plasma treatment can be performed once or twice after CVD deposition of titanium nitride.

Figure 1F:
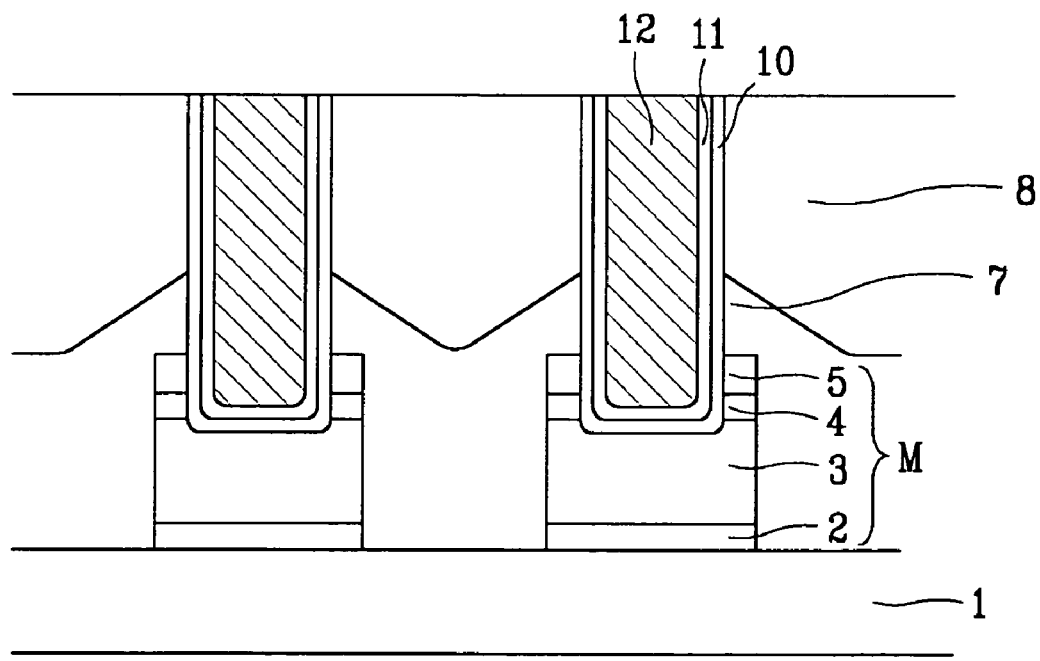

Next, as shown in FIG. 1f, a metallic material is filled up in the via holes 9 fully, and the metallic material is any one selected from tungsten, aluminum, aluminum copper alloy having 0.5% of copper, and copper.

According to one example, tungsten is used as an embodiment. In one arrangement, tungsten is filled up using CVD.

After forming the tungsten layer 12, the tungsten layer 12 is planarized by CMP until the interlayer insulating layer 8 is exposed. At this point, tungsten plugs 12 inside the via holes 9 are completed.

Alternatively, the tungsten layer 12 can be planarized by etching back the tungsten layer 12 until the barrier metal layer 11 on the interlayer insulating layer 8 is exposed.

After completion of tungsten plugs, the above processes can be repeated on upper surfaces of the tungsten plugs and the interlayer insulating layer as many as the number of the metal layers needed in a semiconductor device to form multi-layered metal wiring.

Figure 2:
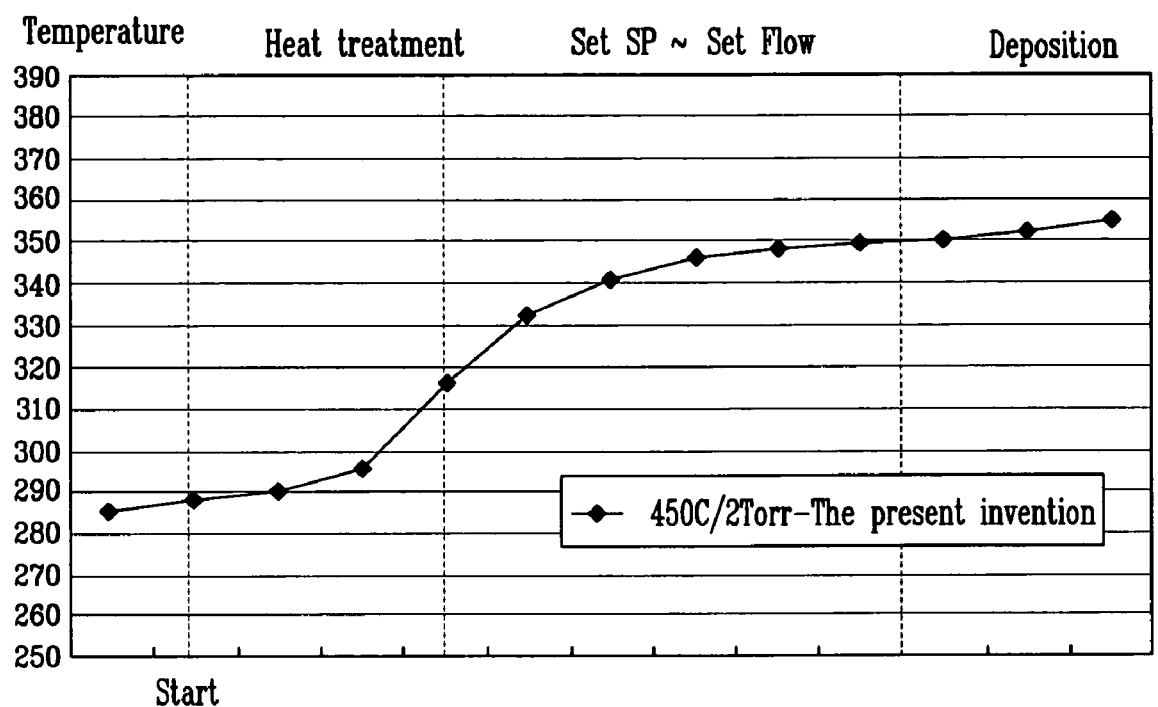
FIG. 2 is a graph showing temperature decrease effect of an embodiment according to the present invention.

FIG. 2 is a graph showing temperature of heat treatment during CVD deposition of titanium nitride. In FIG. 2, the X axis indicates time and the unit of a scale is 5 seconds. The Y axis indicates temperature.

During heat treatment, $N_2$ and He gases are flowed to serve as heat transfer gas by convection. Additionally, the pressure is maintained to be 2 Torr by adjusting valve at fixed flows of $N_2$ 300 sccm and He 500 sccm.

As shown in the graph of FIG. 2, maximum 50 or over of over shooting decrease is obtained, which prevent aluminum from getting loose. As described above, over shooting due to heat during CVD deposition of titanium nitride can be decreased by about 50 to prevent aluminum from getting loose according to the present invention. Therefore, reliability and yield of semiconductor device is improved.

Although certain methods are described herein, the scope of coverage of this patent is not limited thereto. On the contrary, this patent covers every apparatus, method and article of manufacture fairly falling within the scope of the appended claims either literally or under the doctrine of equivalents.

What is claimed is:

1. A formation method of metal wiring of a semiconductor device comprising:
   forming a metal wire on a pre metal dielectric ("PMD") on a semiconductor substrate;
   patterning and sintering the metal wire;
   forming an insulating layer on the metal wire and the PMD;
   forming a via hole in the insulating layer;
   forming a barrier metal layer made of multiple metal layers on inner wall of the via hole and upper surface of the insulating layer using physical vapor deposition and chemical vapor deposition;
   filling up inside the via hole by forming a metallic material on the metal layer; and
   forming a metallic material via by chemical mechanical polishing of the metallic material and the barrier metal layer until the sectional surface of the barrier metal and the surface of the insulating layer are exposed wherein the metal layer comprising aluminum and an upper titanium layer, and wherein the sintering is performed at the temperature of 400–450° C. for 20–50 minutes in an electric furnace is performed for reaction of the aluminum and the upper titanium after the metal wire patterning.

2. A formation method of metal wiring of a semiconductor device as defined by claim 1, wherein the PMD is BPSG, BSG, or PSG.

3. A formation method of metal wiring of a semiconductor device as defined by claim 1, wherein the metal wire has a lower titanium/aluminum/upper titanium/titanium nitride structure or a lower titanium/lower titanium nitride/aluminum/upper titanium/upper titanium nitride structure.

4. A formation method of metal wiring of a semiconductor device as defined by claim 1, wherein a lower layer is formed to fill up the gap of the metal wire by high density plasma or SOG, an interlayer insulating layer is formed on the lower layer, and the interlayer insulating layer is planarized by chemical mechanical polishing, as the insulating layer.

5. A formation method of metal wiring of a semiconductor device as defined by claim 3, wherein the upper titanium nitride is over-etched to expose the layer directly under the upper titanium nitride layer when the via holes are formed in the interlayer insulating layer.

6. A formation method of metal wiring of a semiconductor device as defined by claim 1, wherein titanium and titanium nitride are formed sequentially as the barrier metal layer.

7. A formation method of metal wiring of a semiconductor device as defined by claim 6, wherein the titanium of the barrier metal layer is formed by physical vapor deposition designed to be well-formed to narrow and deep holes and the titanium nitride of the barrier metal layer is formed by chemical vapor deposition ("CVD").

8. A formation method of metal wiring of a semiconductor device as defined by claim 7, wherein pre-heating is performed for 35–50 seconds under the state that N2 200–400 sccm and He 400–600 sccm are flowed into CVD titanium nitride chamber and pressure of the chamber is maintained to be 1.5–3.5 Torr by adjusting gate valve before forming the titanium nitride.

9. A formation method of metal wiring of a semiconductor device as defined by claim 8, wherein temperature of a heater equipped in the CVD titanium nitride chamber is 380–480° C.

10. A formation method of metal wiring of a semiconductor device as defined by claim 8, wherein plasma treatment is performed once or twice after deposition of the CVD titanium nitride layer.

11. A formation method of metal wiring of a semiconductor device as defined by claim 1, wherein the metallic material for filling up the via holes is any one selected from a group of tungsten, aluminum, aluminum alloy having 0.5% of copper, and copper.

12. A formation method of metal wiring of a semiconductor device as defined by claim 11, wherein the tungsten layer is formed by CVD.

* * * * *